United States Patent
Rao

(10) Patent No.: US 9,647,070 B2
(45) Date of Patent: May 9, 2017

(54) SEMICONDUCTOR DEVICES WITH GRADED DOPANT REGIONS

(71) Applicant: GREENTHREAD, LLC, Dallas, TX (US)

(72) Inventor: G. R. Mohan Rao, Allen, TX (US)

(73) Assignee: GREENTHREAD, LLC, Dallas, TX (US)

( * ) Notice: Subject to any disclaimer, the term of this patent is extended or adjusted under 35 U.S.C. 154(b) by 0 days.

(21) Appl. No.: 14/931,636

(22) Filed: Nov. 3, 2015

(65) Prior Publication Data

US 2016/0172447 A1    Jun. 16, 2016

Related U.S. Application Data

(60) Continuation of application No. 14/515,584, filed on Oct. 16, 2014, now Pat. No. 9,190,502, which is a (Continued)

(51) Int. Cl.
| | |
|---|---|
| *H01L 21/02* | (2006.01) |
| *H01L 29/10* | (2006.01) |
| *H01L 27/11521* | (2017.01) |
| *H01L 27/11524* | (2017.01) |
| *H01L 27/146* | (2006.01) |
| *H01L 29/739* | (2006.01) |
| *H01L 29/36* | (2006.01) |
| *H01L 27/02* | (2006.01) |
| *H01L 27/108* | (2006.01) |

(52) U.S. Cl.
CPC .... *H01L 29/1095* (2013.01); *H01L 27/11521* (2013.01); *H01L 27/11524* (2013.01); *H01L 27/14643* (2013.01); *H01L 29/36* (2013.01); *H01L 29/7395* (2013.01); *H01L 27/0214* (2013.01); *H01L 27/10844* (2013.01)

(58) Field of Classification Search
CPC .................................................. H01L 29/1095
USPC .......................................................... 257/655
See application file for complete search history.

(56) References Cited

U.S. PATENT DOCUMENTS

| 4,001,864 A | 1/1977 | Gibbons |
| 4,160,985 A | 7/1979 | Kamins et al. |

(Continued)

OTHER PUBLICATIONS

P.D. Moor, Advanced CMOS-based pixel sensors, https://indico.cem.ch/event/122027/contributions/88236/attachments/69340/99377/FEEimecPdM.pdf, 2011, 41 pages.

(Continued)

*Primary Examiner* — Ajay K Arora
(74) *Attorney, Agent, or Firm* — Howison and Arnott, LLP

(57) ABSTRACT

Most semiconductor devices manufactured today, have uniform dopant concentration, either in the lateral or vertical device active (and isolation) regions. By grading the dopant concentration, the performance in various semiconductor devices can be significantly improved. Performance improvements can be obtained in application specific areas like increase in frequency of operation for digital logic, various power MOSFET and IGBT ICS, improvement in refresh time for DRAM's, decrease in programming time for nonvolatile memory, better visual quality including pixel resolution and color sensitivity for imaging ICs, better sensitivity for varactors in tunable filters, higher drive capabilities for JFET's, and a host of other applications.

4 Claims, 10 Drawing Sheets

A dopant - concentration grinded drift region in a IGBT

Related U.S. Application Data continuation of application No. 13/854,319, filed on Apr. 1, 2013, now abandoned, which is a continuation of application No. 11/622,496, filed on Jan. 12, 2007, now Pat. No. 8,421,195, which is a division of application No. 10/934,915, filed on Sep. 3, 2004, now abandoned.

(56) References Cited

U.S. PATENT DOCUMENTS

| | | |
|---|---|---|
| 4,347,654 A | 9/1982 | Allen et al. |
| 4,481,522 A | 11/1984 | Jastrzebski et al. |
| 4,866,000 A | 9/1989 | Okita |
| 5,029,277 A | 7/1991 | Kane |
| 5,130,262 A | 7/1992 | Masquelier et al. |
| 5,213,988 A | 5/1993 | Yamauchi et al. |
| 5,262,345 A | 11/1993 | Nasser et al. |
| 5,329,144 A | 7/1994 | Luryi |
| 5,448,087 A | 9/1995 | Streit et al. |
| 5,480,816 A | 1/1996 | Uga et al. |
| 5,496,746 A | 3/1996 | Matthews |
| 5,517,052 A | 5/1996 | Ishaque |
| 5,569,612 A | 10/1996 | Frisina et al. |
| 5,575,862 A | 11/1996 | Nishida |
| 5,637,898 A | 6/1997 | Baliga |
| 5,797,999 A | 8/1998 | Sannomiya et al. |
| 5,888,857 A | 3/1999 | Zhang et al. |
| 5,973,575 A | 10/1999 | Kamogawa et al. |
| 6,211,028 B1 | 4/2001 | Tsai et al. |
| 6,310,366 B1 | 10/2001 | Rhodes et al. |
| RE37,441 E | 11/2001 | Yamazaki |
| 6,452,086 B1 | 9/2002 | Muller |
| 6,465,862 B1 | 10/2002 | Harris |
| 6,472,715 B1 | 10/2002 | Liu et al. |
| 6,670,544 B2 | 12/2003 | Kibbel et al. |
| 6,683,343 B2 | 1/2004 | Matsudai et al. |
| 6,696,314 B2 | 2/2004 | Rhodes |
| 6,706,550 B2 | 3/2004 | Lee et al. |
| 6,713,813 B2 | 3/2004 | Marchant |
| 6,720,622 B1 | 4/2004 | Yu |
| 6,737,722 B2 | 5/2004 | Yamamoto et al. |
| 6,744,117 B2 | 6/2004 | Dragon et al. |
| 6,747,883 B2 | 6/2004 | Yasumura |
| 6,753,202 B2 | 6/2004 | Chen et al. |
| 6,754,093 B2 | 6/2004 | Lien |
| 6,756,616 B2 | 6/2004 | Rhodes |
| 6,831,292 B2 | 12/2004 | Currie et al. |
| 6,921,943 B2 | 7/2005 | Kenney et al. |
| 7,115,925 B2 | 10/2006 | Rhodes |
| 7,307,327 B2 | 12/2007 | Bahl et al. |
| 8,164,124 B2 | 4/2012 | Liu et al. |
| 2001/0040622 A1 | 11/2001 | Maruyama |
| 2002/0056883 A1 | 5/2002 | Baliga |
| 2002/0074585 A1 | 6/2002 | Tsang et al. |
| 2002/0084430 A1 | 7/2002 | Bamji et al. |
| 2002/0093281 A1 | 7/2002 | Cathey |
| 2002/0102783 A1 | 8/2002 | Fujimoto et al. |
| 2002/0134419 A1 | 9/2002 | Macris |
| 2003/0026126 A1 | 2/2003 | Uemura |
| 2003/0030488 A1* | 2/2003 | Hueting ............ H01L 29/0821 330/57 |
| 2003/0042511 A1 | 3/2003 | Rhodes |
| 2004/0027753 A1 | 2/2004 | Friedrichs et al. |
| 2006/0113592 A1 | 6/2006 | Pendharkar et al. |
| 2013/0001661 A1 | 1/2013 | Mao et al. |
| 2015/0200314 A1 | 7/2015 | Webster |

OTHER PUBLICATIONS

E. Parton, CMOS Sensors, Laser Focus World, http://www.laserfocusworld.com/articles/print/volume-49/issue-10/features/cmos-sensors-cmos-based-specialty-imagers-reach-new-performance-levels.html, Oct. 14, 2013, 5 pages.

Z. Cao, Design of Pixel for High Speed CMOS Image Sensors, http://www.imagesensors.org/Past%20Workshops/2013%20Workshop/2013%20Papers/07-11_072-Cao_paper.pdf, 4 pages.

M. Tanenbaum, BSTJ: Diffused Emitter and Base Silicon Transistors, The Bell System Technical Journal, Jan. 1956, 22 pages, vol. XXXV, https://archive.org/details/bstj35-1-1.

IMEC Image Sensors and Vision Systems, http://www2.imec.be/content/user/File/Brochures/cmos%20imagers%20brochure-april26.pdf, Apr. 2014, 2 pages.

A. S. Grove, Physics and Technology of Semiconductor Devices, John Wiley Sons, Inc., New York, Nov. 1967.

W. Murray Bullis and W. R. Runyan, Influence of Mobility and Lifetime Variations on Drift-Field Effects in Silicon-Junction Devices, IEEE Transactions on Electron Devices, vol. Ed-14, No. 2, Feb. 1967.

Berinder Brar et al., Herb's Bipolar Transistors, IEEE Transactions on Electron Devices, vol. 48, No. 11, Nov. 2001.

* cited by examiner

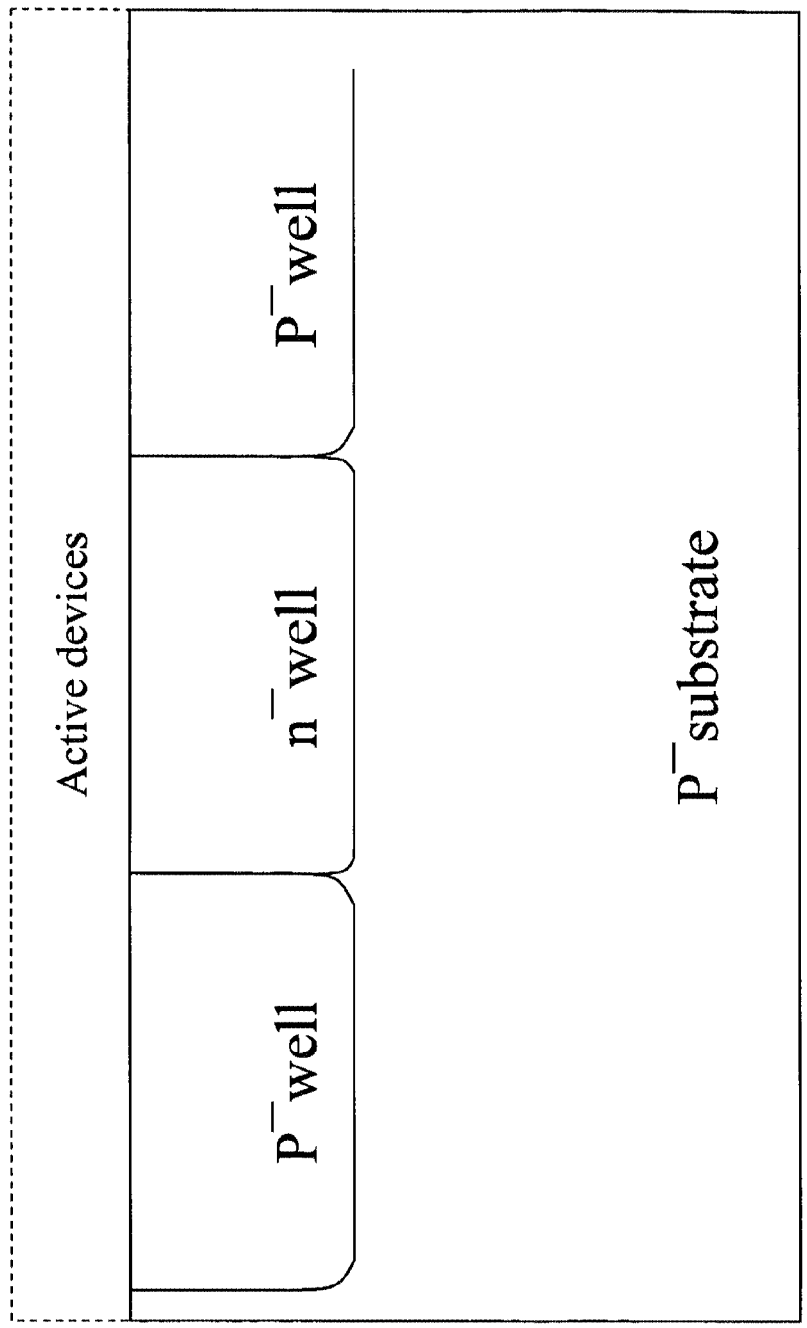
FIGURE 3(a) Prior art (Twin well CMOS) for a CMOS integrated circuit

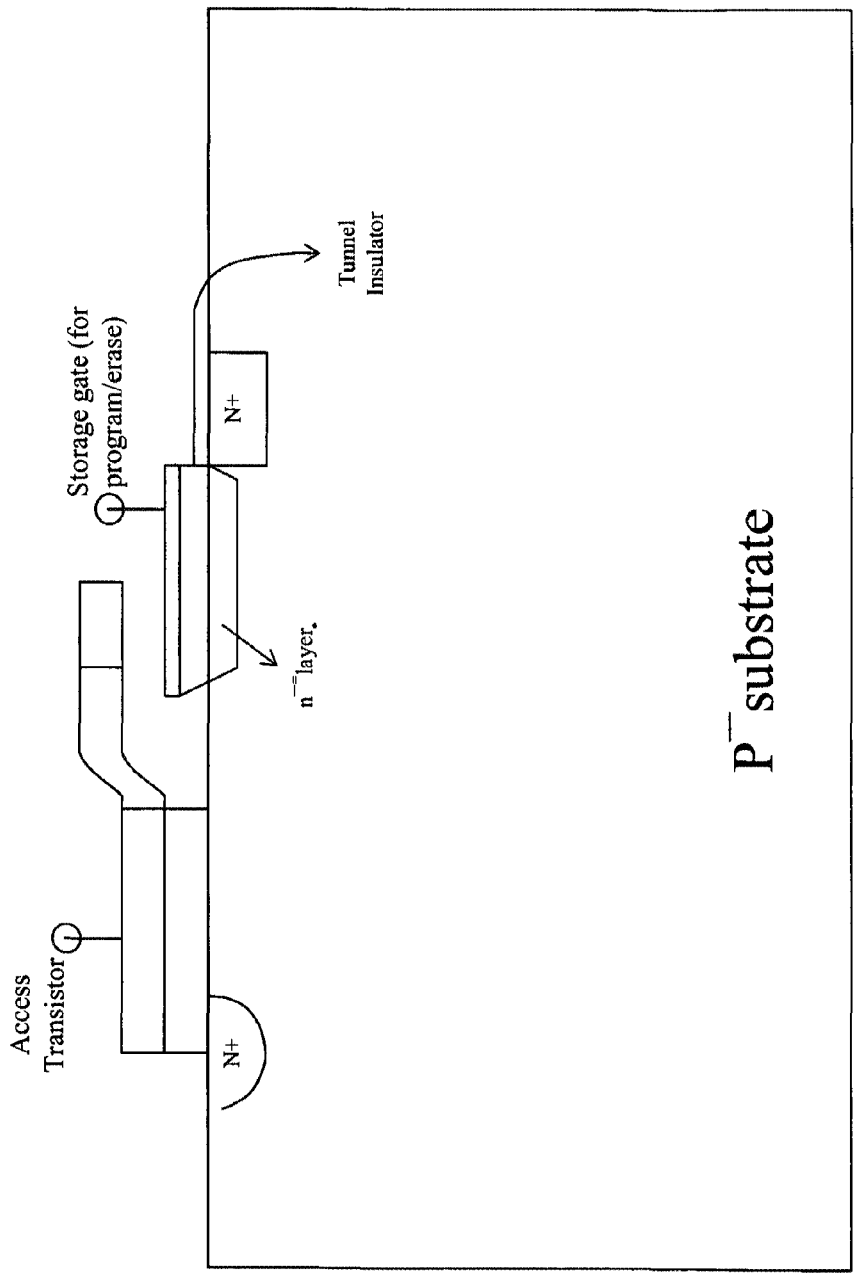
FIGURE 3(b) Prior art for a two-device EEPROM memory cell

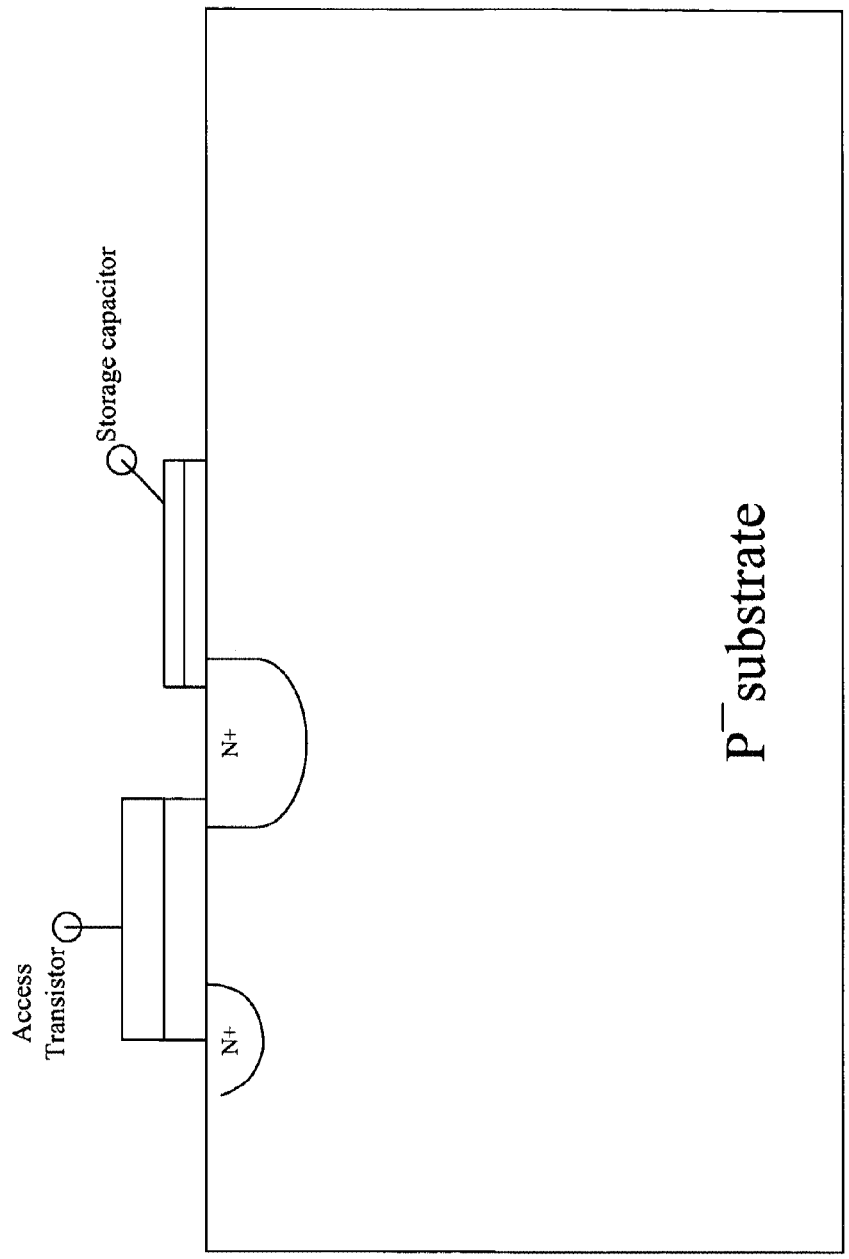
FIGURE 3(c) Prior art for a 1T-1C DRAM memory cell

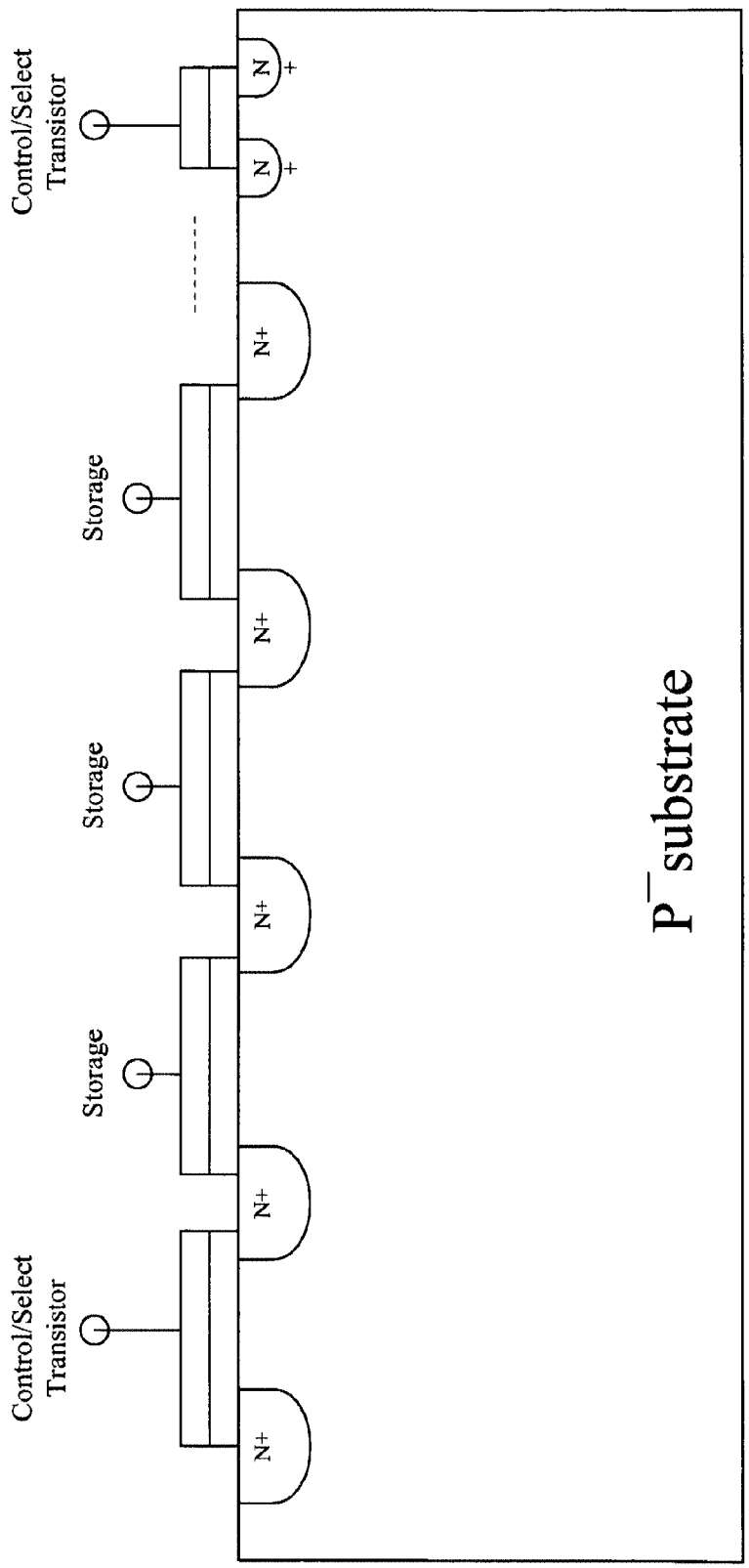
FIGURE 3(d) Prior art for a NAND flash memory cell
Note: Control/Sect transistors have a single insulator - traditional MOS transistor.
Storage nodes have a stacked gate structure, typically with a floating gate and control gate comprising the stack.

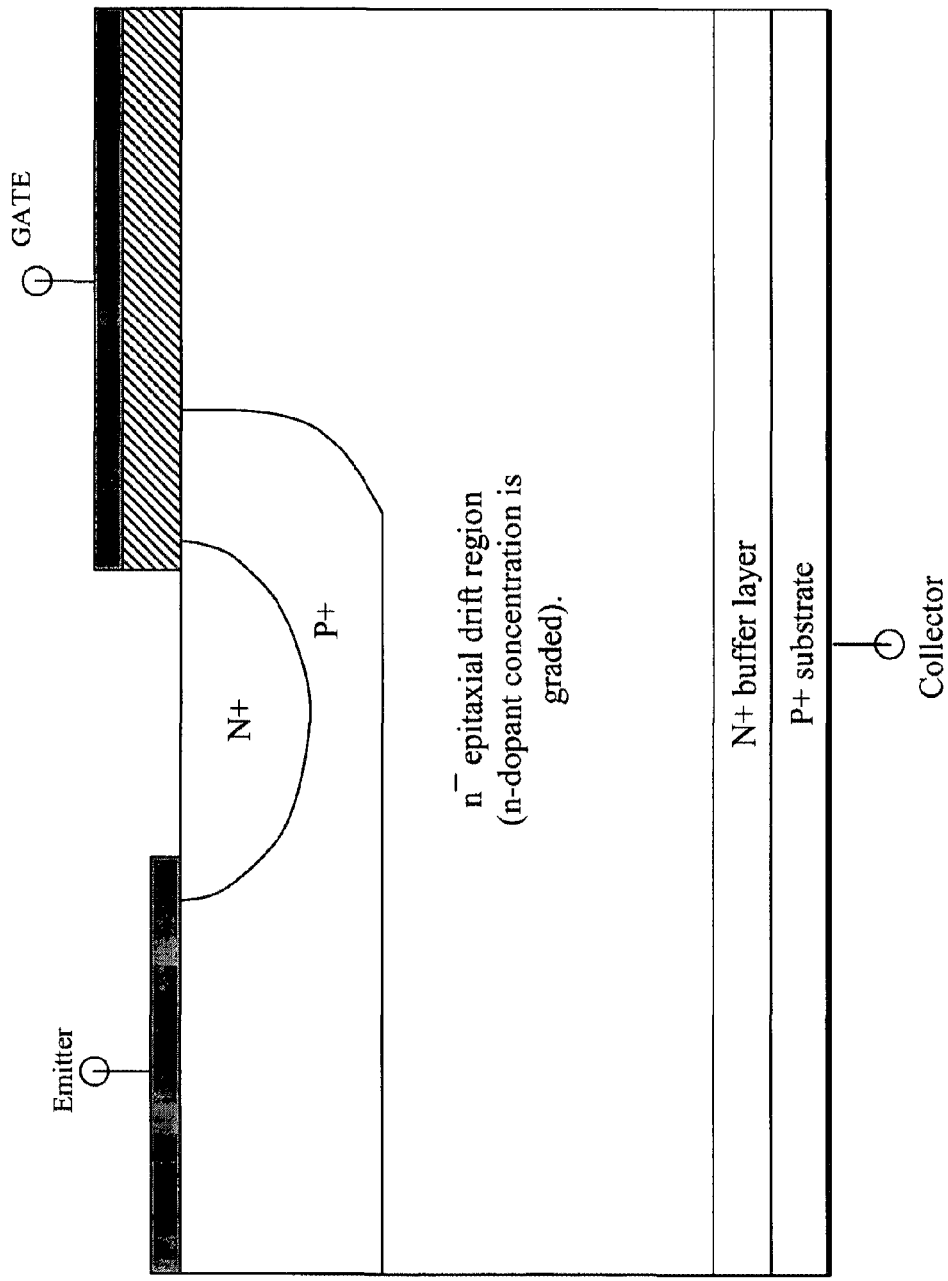
FIGURE 4 A dopant - concentration grinded drift region in a IGBT

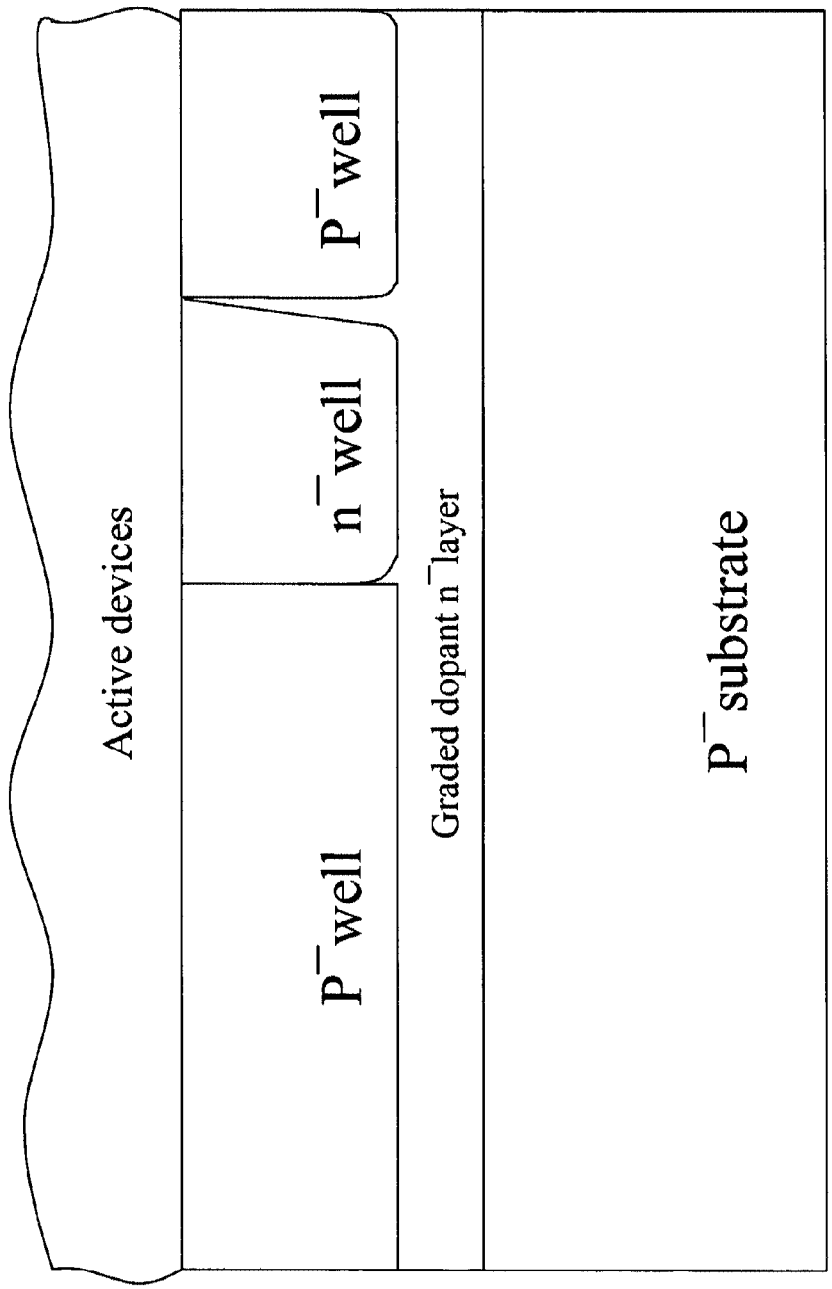
FIGURE 5(a) A CMOS Substrate for digital, mixed, signal, and senors IC's

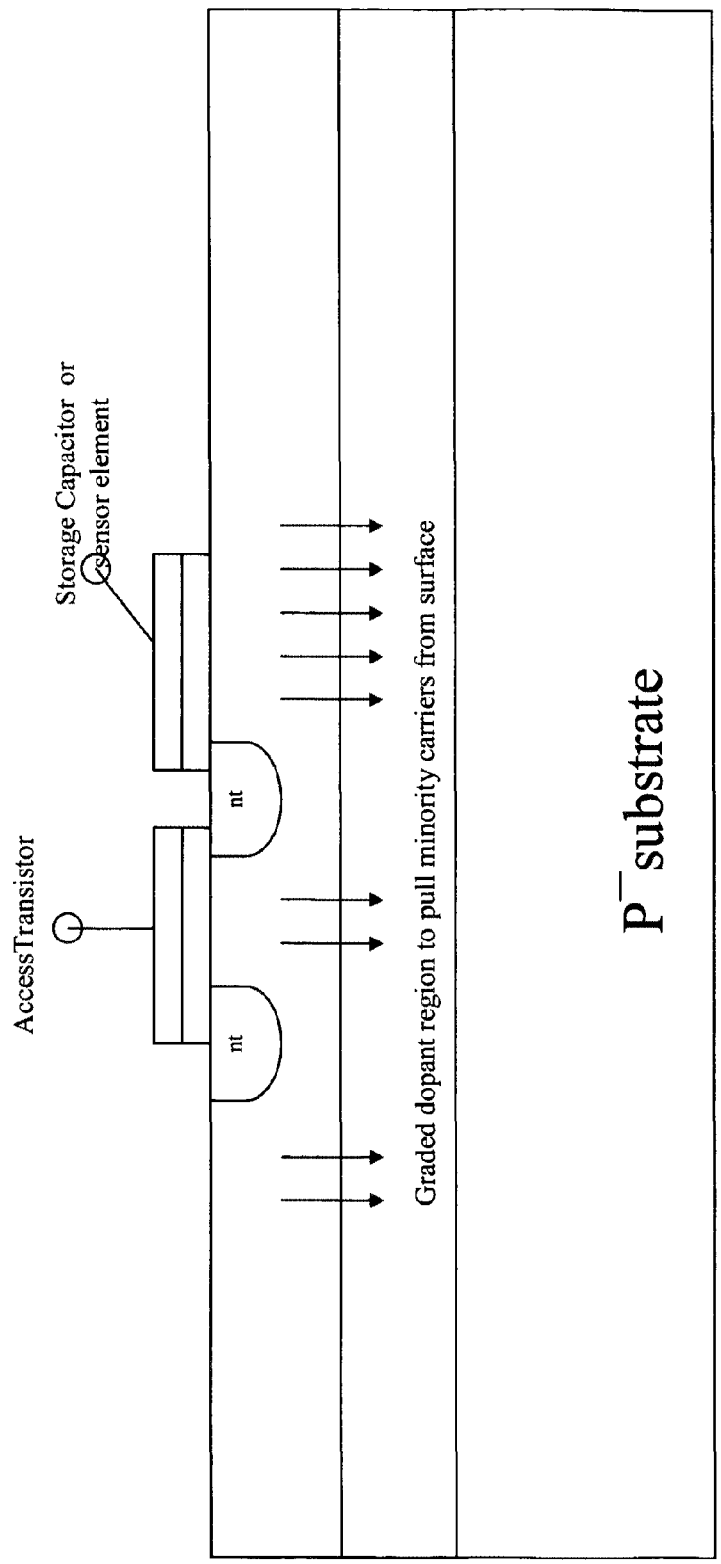
FIGURE 5(b) CMOS Substrate for a DRAM or image sensor, with one embodiment of the invention

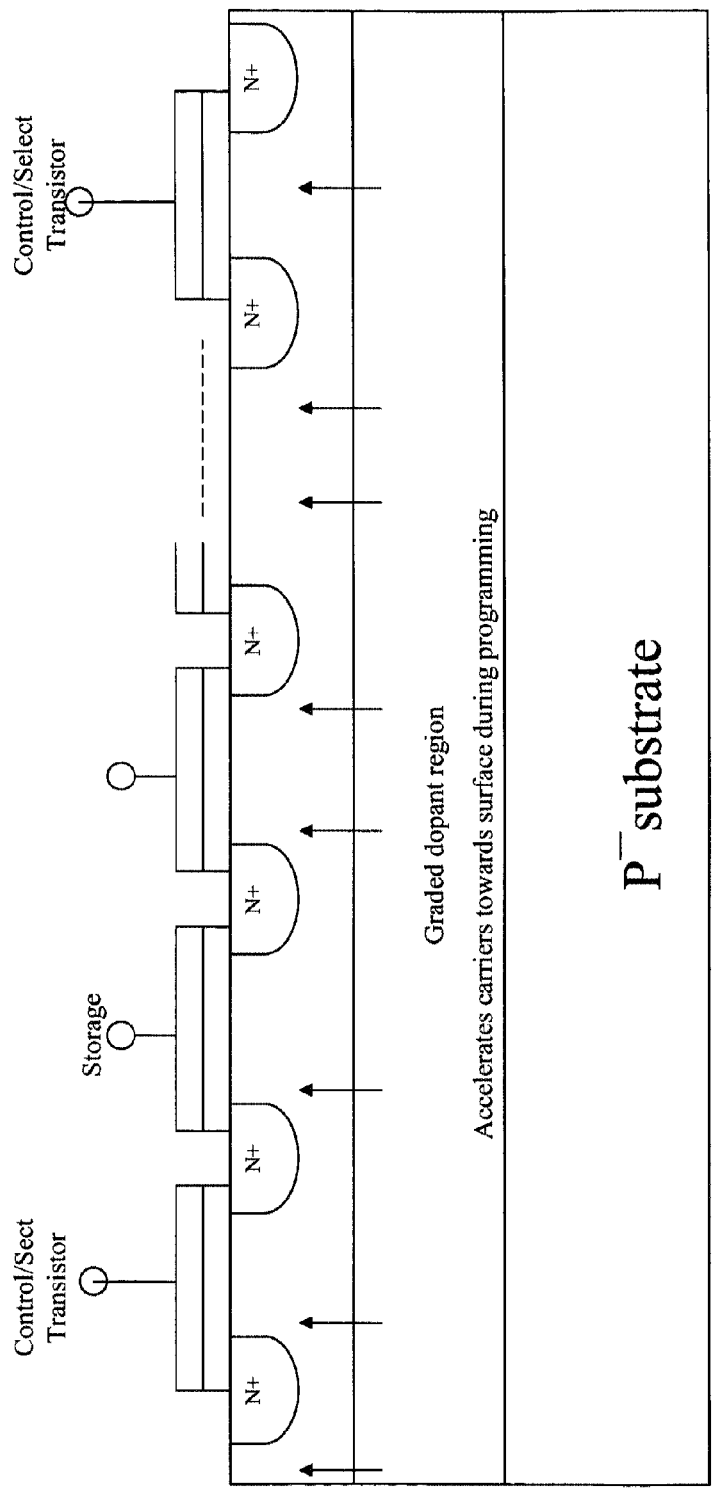
FIGURE 5(c) CMOS Substrate for a NAND flash device to improve programming times

SEMICONDUCTOR DEVICES WITH GRADED DOPANT REGIONS

CROSS-REFERENCE TO RELATED APPLICATIONS

This application is a Continuation of U.S. patent application Ser. No. 14/515,584, filed Oct. 16, 2014, published on Feb. 5, 2015, as U.S. Publication No. 2015-0035004, now U.S. Pat. No. 9,190,502, issued on Nov. 17, 2015, (GRTD-32613). Application Ser. No. 14/515,584 is a Continuation of U.S. patent application Ser. No. 13/854,319 filed Apr. 1, 2013, published on Aug. 29, 2013, as U.S. Publication No. 2013-0221488 (GRTD-32626). Application Ser. No. 13/854,319 is a Continuation of Ser. No. 11/622,496, filed Jan. 12, 2007, published on Jul. 12, 2007, as Publication No. 2007-0158790, now U.S. Pat. No. 8,421,195, issued on Apr. 16, 2013 (GRTD-32611). Application Ser. No. 11/622,496, is a Division of U.S. patent application Ser. No. 10/934,915, filed Sep. 3, 2004, published on Mar. 9, 2006, as U.S. Publication No. 2006-0049464 (GRTD-32625). U.S. Pat. Nos. 9,190,502, and 8,421,195, and Patent Application Publication Nos. 2015-0035004, 2013-0221488, 2007-0158790, and 2006-0049464, are incorporated herein by reference in their entirety.

TECHNICAL FIELD

This present invention relates to all semiconductor devices and systems. Particularly it applies to diffused diodes, avalanche diodes, Schottky devices, power MOS transistors, JFETs, RF bipolar transistors, IGBTs (Insulated Gate Bipolar Transistors), varactors, digital VLSI, mixed signal circuits and sensor devices including camera ICs employing CCD (Charge Coupled Device) as well as CMOS technologies.

BACKGROUND

Bipolar Junction transistors (BJT) are minority carrier devices as the principle device conduction mechanism. However, majority carriers also a small yet finite role in modulating the conductivity in BJTs. Consequently, both carriers (electrons and holes) play a role in the switching performance of BJTs. The maximum frequency of operation in BJTs is limited by the base transit time as well as the quick recombination of the majority carriers when the device is switched off (prior to beginning the next cycle). The dominant carrier mechanism in BJTs is carrier diffusion. Carrier drift current component is fairly small, especially in uniformly doped base BJTs. Efforts have been made in graded base transistors to create an 'aiding drift field', to enhance the diffusing minority carrier's speed from emitter to collector. However, most semiconductor devices, including various power MOSFETs (traditional, DMOS, lateral, vertical and a host of other configurations), IGBT's (Insulated Gated Base Transistors), still use a uniformly doped 'drift epitaxial' region in the base. FIG. 1 shows the relative doping concentration versus distance in a BJT. FIG. 2 shows the 'uniformly doped epi region' in a IGBT. In contrast to BJTs, MOS devices are majority carrier devices for conduction. The conduction is channel dominated. The channel can be a surface in one plane in planar devices. The surface can also be on the sidewalls in a vertical device. Other device architectures to combine planar and vertical conductions are also possible. The maximum frequency of operation is dictated primarily by source-drain separation distance. Most MOS devices use a uniformly doped substrate (or a well region). When a MOSFET is optimillay integrated with a BJT in a monolithic fashion, an IGBT results. The IGBT inherits the advantages of both MOSFET and BJT. It also brings new challenges because the required characteristics (electron transit and hole recombination as fast as possible in the case of an n-channel IGBT) require different dopant gradients either in the same layer at different positions, or at the interfaces of similar or dissimilar layers.

'Retrograde' wells have been attempted, with little success, to help improve soft error immunity in SRAM's and visual quality in imaging circuits. FIG. 3(a) shows a typical CMOS VLSI device employing a twin well substrate, on which active devices are subsequently fabricated. FIGS. 3(b), 3(c), and 3(d) illustrate device cross sections, as practiced today. 'Retrograde' and 'halo' wells have also been attempted to improve refresh time in DRAM's (dynamic random access memories), as well as, reducing dark current (background noise) and enhance RGB (Red, Green, Blue) color resolution in digital camera Ics. Most of these techniques either divert the minority carriers away form the active regions of critical charge storage nodes at the surface, or, increase minority carrier density locally as the particular application requires.

BRIEF DESCRIPTION OF THE DRAWINGS

For a more complete understanding of the present invention, and the advantages thereof, reference is now made to the following descriptions taken in conjunction with the accompanying drawings, in which:

FIGS. 3(a), 3(b), 3(c), 3(d) illustrate cross sections commonly used CMOS silicon substrate with two wells (one n-well in which p-channel transistors are subsequently fabricated, and, one p-well in which n-channel transistors are subsequently fabricated)—typical IC, EEPROM using tunnel insulator, DRAM and NAND flash;

FIG. 4 illustrates the cross section of a IGBT, using one embodiment of the invention described here, where the dopant is optimally graded in the epitaxial drift region; and FIGS. 5(a), 5(b), 5(c) illustrate the cross sections of a MOS silicon substrate with two wells, and, an underlying layer using embodiments of the invention to improve performance in each application—VLSI logic, DRAM/image IC, nonvolatile memory IC.

DETAILED DESCRIPTION

Figure 1:
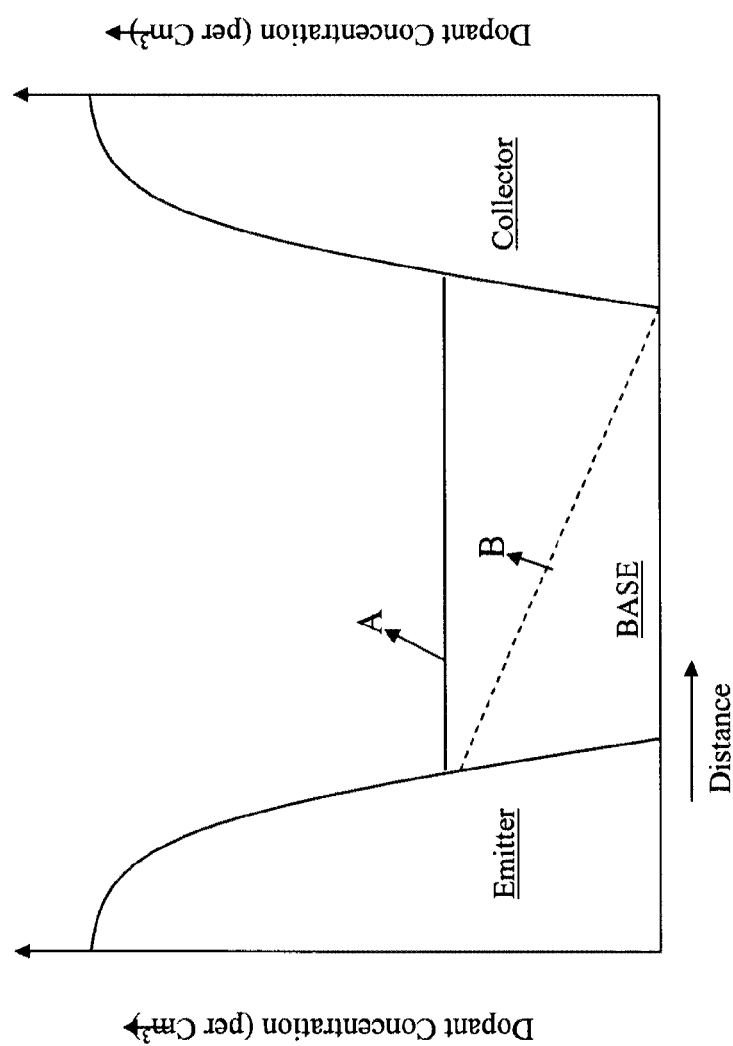
FIG. 1 illustrates the relative doping profiles of emitter, base, and collector, for the two most popular bipolar junction transistors: namely, A—uniform base, and B—graded base.
Figure 2:
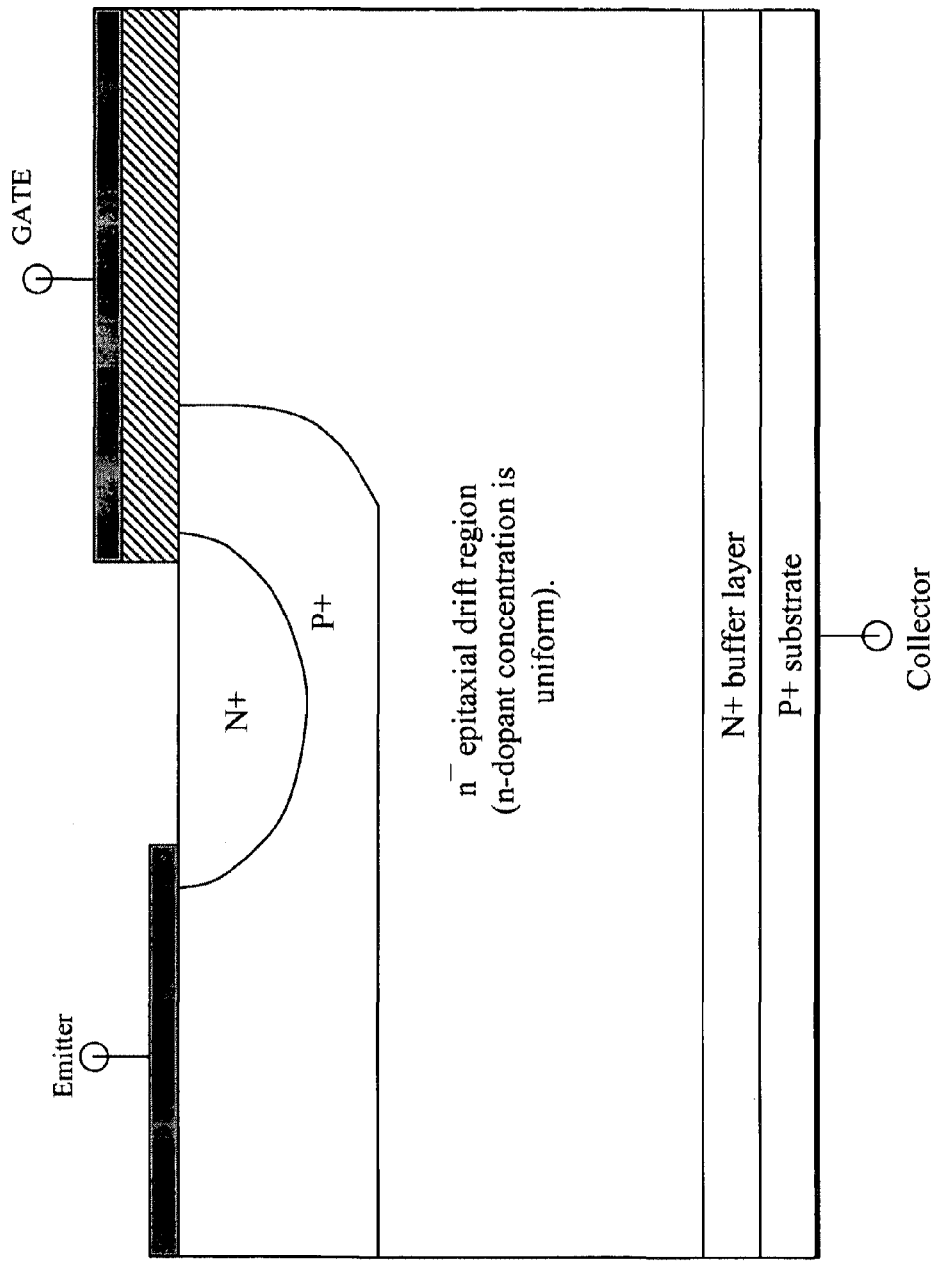
FIG. 2 illustrates the cross section of a commercial IGBT with a uniform epitaxial drift region (base)

The relative doping concentrations of emitter and collector regions varies from $10^{18}$ to $10^{20}/cm^3$, where as the base region is $10^{14}$ to $10^{16}/cm^3$ depending on the desired characteristics of the BJT. In graded base p-n-p transistors, the donor dopant concentration may be 10 to 100× at the emitter-base junction, relative to the base-collector junction (1×). The gradient can be linear, quasi linear, exponential or complimentary error function. The relative slope of the donor concentration throughout the base, creates a suitable aiding drift electric field, to help the holes (p-n-p transistor) transverse from emitter to collector. Since the aiding drift field helps hole conduction, the current gain at a given frequency is enhanced, relative to a uniformly-doped-(base) BJT. The improvement in cut-off frequency (or, frequency at unity gain, $f_T$) can be as large as 2×-5×. Similar performance improvements are also applicable to n-p-n transistors.

As illustrated in FIG. 4, in one embodiment according to the invention, a donor gradient is established from the emitter-drift epitaxial base region junction of the punch-through IGBT, to the drift epitaxial base region—$n^r$ buffer layer boundary (electrons in this case are accelerated in their transit from emitter to collector). The 'average' base resistance is optimized, so that conductivity modulation and lifetime (for minority carriers) in base region are not compromised. By sweeping the carriers towards the $n^r$ buffer region two advantages are obtained—the frequency of operation (combination of $t_{on}$ and $t_{off}$ as is known in the IGBT commercial nomenclature) can be enhanced. More importantly, during $t_{off}$, holes can be recombined much quicker at the $n^r$ buffer layer, compared to a uniformly doped $n^-$ epitaxial drift region by establishing a different dopant gradient near the n+ buffer layer. It should be noted that the drift region can also be a non-epitaxial silicon substrate. Epitaxy enhances lifetime, but, epitaxy is not mandatory. Different layers of dopant regions can be transferred through wafer to wafer bonding (or other similar transfer mechanisms) for eventual device fabrication. The "reverse recovery time" for an IGBT is significantly improved due to the optimized graded dopant in the so called "drift region" as well as at the interfaces of the drift region. Graded dopants can also be implemented in the n+ buffer layer as well as other regions adjacent to the respective layers. Two important performance enhancements are the result of dopant gradients. For example, in an n-channel IGBT, electrons can be swept from source to drain rapidly, while at same time holes can be recombined closer to the n+ buffer layer. This can improve t(on) and t(off) in the same device.

As illustrated in FIGS. 5(a), 5(b), 5(c), donor gradient is also of benefit to very large scale integrated circuits (VLSI)—VLSI logic, DRAM, nonvolatile memory like NAND flash. Spurious minority carriers can be generated by clock switching in digital VLSI logic and memory IC'S. These unwanted carriers can discharge dynamically-held 'actively held high' nodes. Statically held nodes (with $V_{cc}$) can not be affected, in most cases. Degradation of refresh time in DRAM's is one of the results, because the capacitor holds charge dynamically. Similarly, degradation of CMOS digital images, in digital imaging IC's is another result of the havoc caused by minority carriers. Pixel and color resolution can be significantly enhanced in imaging IC's with the embodiments described here. Creating 'Sub Terrain' recombination centers underneath the wells (gold doping, platinum doping) as is done in some high-voltage diodes is not practical for VLSI circuits. Hence, a novel technique has been described here by creating a drift field to sweep these unwanted minority carriers into the substrate as quickly as possible, from the active circuitry at the surface. In a preferred embodiment, the subterrain n-layer has a graded donor concentration to sweep the minority carriers deep into the substrate. One or more of such layers can also be implemented through wafer to wafer bonding or similar "transfer" mechanisms. This n-layer can be a deeply-implanted layer. It can also be an epitaxial layer. The n-well and p-well also can be graded or retrograded in dopants, as desired, to sweep those carriers away from the surface as well. The graded dopant can also be implemented in surface channel MOS devices to accelerate majority carriers towards the drain. In nonvolatile memory devices, to decrease programming time, carriers should be accelerated towards the surface when programming of memory cells is executed. The graded dopant can also be used to fabricate superior Junction field-effect transistors where the "channel pinchoff" is controlled by a graded channel instead of a uniformly doped channel (as practiced in prior art).

One of ordinary skill and familiarity in the art will recognize that the concepts taught herein can be customized and tailored to a particular application in many advantageous ways. For instance, minority carriers can be channeled to the surface, to aid programming in nonvolatile memory devices (NOR, NAND, multivalued-cell). Moreover, single well, as well triple-well CMOS fabrication techniques can also be optimized to incorporate these embodiments, individually and collectively. Any modifications of such embodiments (described here) fall within the spirit and scope of the invention. Hence, they fall within the scope of the claims described below Although the invention has been described with reference to specific embodiments, these descriptions are not meant to be construed in a limiting sense. Various modifications of the disclosed embodiments, as well as alternative embodiments of the invention will become apparent to persons skilled in the art upon reference to the description of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

It is therefore, contemplated that the claims will cover any such modifications or embodiments that fall within the true scope of the invention.

What is claimed is:

1. A semiconductor device, comprising:
a substrate of a first doping type at a first doping level having first and second surfaces;
an active region disposed adjacent the first surface of the substrate with a second doping type opposite in conductivity to the first doping type;
circuitry formed in a portion of the active region disposed away from the first surface of the substrate and having at least one region of higher conductivity of the second doping type relative to the doping level in the remainder of the active region proximate the at least one region;
at least a portion of the active region proximate the first surface of the substrate and not containing the at least one region defined with a graded dopant concentration, to aid carrier movement from an emitter in the active region to a collector in the substrate, the graded dopant concentration greater proximate the first surface of the substrate.

2. The semiconductor device of claim 1, wherein the active region has a surface opposite to the first surface of the substrate and the circuitry is disposed in the surface of the active region and the circuitry includes the at least one region.

3. The semiconductor device of claim 1, wherein the graded dopant concentration extends from a high concentration proximate and along the first surface of the substrate into the at least a portion of the active region and decreasing in concentration as it extends distal to the first surface of the substrate.

4. The semiconductor device of claim 3, wherein the at least a portion of the active region extends from the first surface of the substrate into the active region with a portion of the active region above the first source of the substrate not including the at least a portion of the active region.

* * * * *